United States Patent
Peh

(10) Patent No.: US 12,549,188 B2
(45) Date of Patent: Feb. 10, 2026

(54) PLL USING A DCO PERIOD LENGTH FEEDBACK CLOCK PULSE TO DETERMINE PHASE ERROR AND TDC GAIN

(71) Applicant: Silicon Laboratories Inc., Austin, TX (US)

(72) Inventor: Sheng Jue Peh, Singapore (SG)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 18/592,896

(22) Filed: Mar. 1, 2024

(65) Prior Publication Data

US 2025/0279783 A1   Sep. 4, 2025

(51) Int. Cl.
| | |
|---|---|
| H03L 7/107 | (2006.01) |
| G04F 10/00 | (2006.01) |
| H03L 7/081 | (2006.01) |
| H03L 7/093 | (2006.01) |
| H03L 7/099 | (2006.01) |

(52) U.S. Cl.
CPC .......... *H03L 7/1075* (2013.01); *G04F 10/005* (2013.01); *H03L 7/081* (2013.01); *H03L 7/093* (2013.01); *H03L 7/099* (2013.01)

(58) Field of Classification Search
CPC ... H03L 2207/50; H03L 7/085; H03L 7/1976; H03L 7/093; H03L 7/0991; H03L 7/1974; H03L 7/091; H03L 7/0992; H03L 7/197
See application file for complete search history.

(56) References Cited

U.S. PATENT DOCUMENTS

| | | |
|---|---|---|
| 8,971,455 B2 | 3/2015 | Ganesan |
| 10,763,869 B2 * | 9/2020 | Khoury ..................... H03L 7/16 |

OTHER PUBLICATIONS

Hussein, A., et al., "A 50-66 GHz Phase-Domain Digital Frequency Synthesizer with Low Phase Noise and Low Fractional Spurs," IEEE Journal of Solid-State Circuits, vol. 52, No. 12, Sep. 27, 2017, 19 pages.
Perrott, M., "Tutorial on Digital Phase-Locked Loops CICC 2009," Custom Integrated Circuits Conference, Sep. 2009, 118 pages downloaded from https://www.cppsim.com/PLL_Lectures/digital_pll_cicc_tutorial_perrott.pdf on Jan. 3, 2024.

(Continued)

*Primary Examiner* — Diana J. Cheng
(74) *Attorney, Agent, or Firm* — Zagorin Cave LLP

(57) ABSTRACT

A phase-locked loop (PLL) includes a digitally controlled oscillator (DCO) that generates a DCO output signal. A feedback divider is coupled to the DCO output signal, divides the DCO output signal, and generates a feedback clock signal. The feedback clock signal is generated as a pulse having a pulse width equal to one period of the DCO output signal. A time-to-digital converter (TDC) receives a reference clock signal and the feedback clock signal and generates a TDC output that indicates a phase difference between the reference clock signal and the feedback clock signal. The TDC output also provides gain information indicating how many delay elements correspond to the period of the DCO output signal. The gain information can be used to more accurately cancel quantization error in the PLL.

18 Claims, 4 Drawing Sheets

(56) References Cited

OTHER PUBLICATIONS

Staszewski, R., et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, vol. 50, No. 11, Nov. 2003, pp. 815-828.
Staszewski, R., et al., "All-Digital PLL and Transmitter for Mobile Phones," IEEE Journal of Solid-State Circuits, vol. 40, No. 12, Dec. 2005, pp. 2469-2482.
Staszewski, R., "Digital Deep-Submicron CMOS Frequency Synthesis for RF Wireless Applications," Dissertation, University of Texas at Dallas, Aug. 2002, 319 pages.
Texas Instruments, "AN-1879 Fractional N Frequency Synthesis," SNAA062B, Apr. 2013, revised Nov. 2021 downloaded from https://www.ti.com/lit/pdf/snaa062 on Jan. 31, 2024, 28 pages.

\* cited by examiner

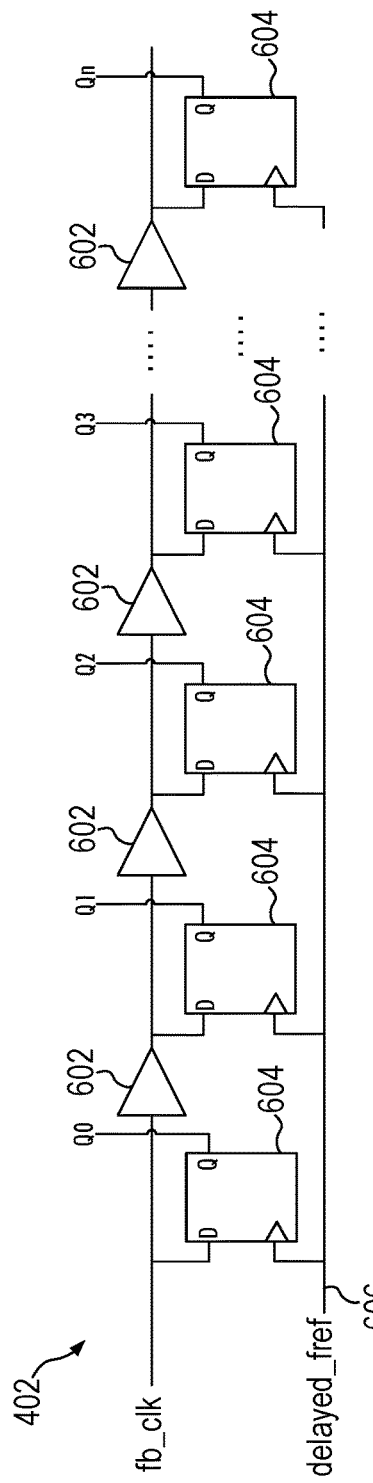
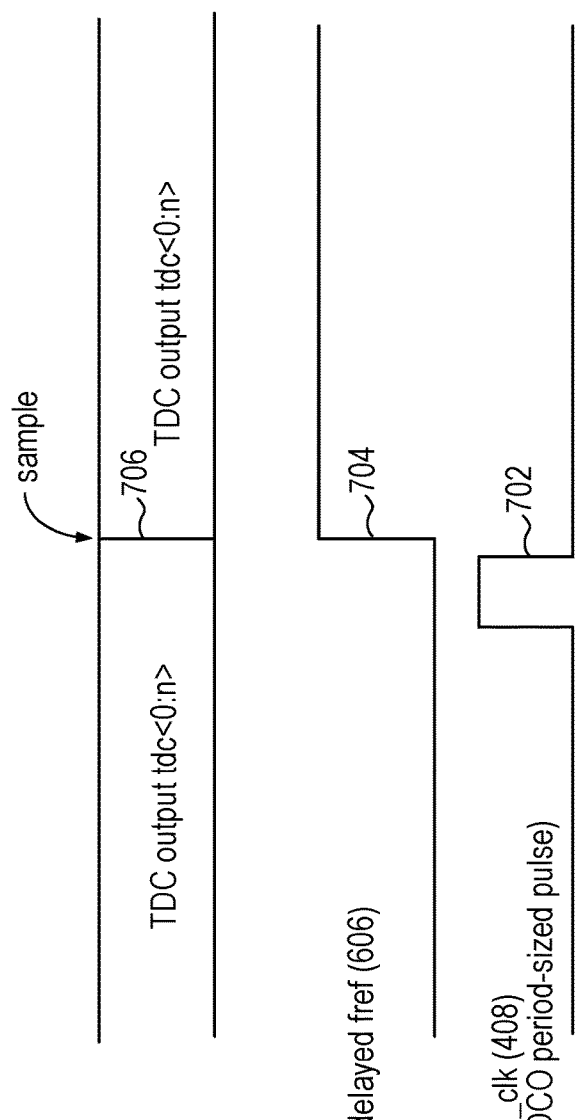
Fig. 6
Fig. 7

PLL USING A DCO PERIOD LENGTH FEEDBACK CLOCK PULSE TO DETERMINE PHASE ERROR AND TDC GAIN

CROSS-REFERENCE TO RELATED APPLICATION(S)

This application relates to application Ser. No. 18/592,910, filed Mar. 1, 2024, naming Sheng Jue Peh as inventor, and entitled "Feedback Divider in a PLL Used As A Phase/Frequency Detector", which application is incorporated herein by reference in its entirety.

BACKGROUND

Field of the Invention

This disclosure relates to phase-locked loops (PLLs) and more particularly to utilization of a time-to-digital converter (TDC) to provide phase error and TDC gain information.

Description of the Related Art

FIG. 1 illustrates a high level block diagram of a conventional digital PLL 100. The PLL 100 includes a time-to-digital converter (TDC) 102 that supplies a phase difference (also referred to herein as phase error) 104 between the reference clock (fref) 106 and feedback clock signal (fb_clk) 108. The phase difference 104 is supplied to the digital loop filter 110 that supplies a control signal 112 to a digitally controlled oscillator (DCO) 114. The DCO 114 supplies an output signal 116 to the feedback divider 118, which in turn divides the DCO_OUT signal 116 to generate fb_clk 108. FIG. 2 illustrates a phase difference at 202 that can occur between fref 106 and fb_clk 108. Note that both clock signals have the same duty cycle (conventionally 50%) and when aligned have the same rising (and falling) edges. FIG. 3 illustrates a representative output from the TDC when the PLL is locked assuming a 40 bit output. In the illustrated embodiment the TDC output is half 1's and half 0's when locked. That is tdc_out<0:19>=1s and tdc_out<20:39>=0s. The reference clock fref or a delayed version of fref is used to sample the TDC output. The phase information is based on the 0 crossing in the TDC output shown at 302. Remember that the phase error supplied by the TDC is used to keep the PLL locked. With temperature and/or supply voltage changes, the delay through the delay elements of the TDC may change and number of delay elements that are "1" and "0" when locked may change slightly, e.g., to 19 "1s" and 21 "0s. That change relates to the gain relationship between the TDC output and the DCO output. In conventional PLLs, one way to determine the gain relationship requires taking the PLL out of lock, which means the PLL is no longer supplying a clock signal operationally that is locked to the reference clock signal. Another approach algorithmically checks the output error and adjusts the gain until the error is minimized. Improvements in determining the gain relationship can help improve PLL operation.

SUMMARY OF EMBODIMENTS OF THE INVENTION

In embodiments, the phase error and gain information from the TDC is determined simultaneously during normal operation of the PLL.

In an embodiment a method includes recovering phase information from an output of a time-to-digital converter (TDC). The phase information is indicative of a phase difference between a reference clock signal and a feedback clock signal. In addition, gain information is recovered from the output of the TDC. The gain information is indicative of a relationship between a step size of the TDC and a period of a digitally controlled oscillator (DCO) output signal supplied by a digitally controlled oscillator (DCO). In an embodiment, the feedback clock signal has a pulse width equal to a period of the DCO output signal.

In another embodiment a phase-locked loop (PLL) includes a time-to-digital converter (TDC) that is coupled to receive a reference clock signal and a feedback signal. The TDC provides a TDC output that is indicative of a phase difference between the reference clock signal and the feedback signal. A feedback divider is coupled to a digitally controlled oscillator (DCO) output signal and configured to divide the DCO output signal and supply the feedback signal to the TDC. The TDC output further provides gain information that is indicative of a relationship between a step size of the TDC and a period of the DCO output signal.

In another embodiment an apparatus includes a digitally controlled oscillator (DCO) that is configured to supply a DCO output signal. A feedback divider is coupled to the DCO output signal and is configured to divide the DCO output signal and supply a feedback signal. The feedback clock signal includes a pulse with a pulse width of a period of the DCO output signal. A time-to-digital converter (TDC) is coupled to receive a reference clock signal and the feedback signal and is configured to provide a TDC output indicative of a phase difference between the reference clock signal and the feedback signal. The phase difference indicated is based on a transition between zeros and ones in the TDC output. The TDC output further provides gain information indicating a relationship between a step size of the TDC and a period of the DCO output clock signal.

BRIEF DESCRIPTION OF THE DRAWINGS

The present invention may be better understood, and its numerous objects, features, and advantages made apparent to those skilled in the art by referencing the accompanying drawings.

FIG. 6 illustrates a block diagram of an embodiment of the TDC.

FIG. 7 illustrates the feedback clock pulse, the delayed reference clock signal used to sample the TDC and the sampling point for the TDC.

DETAILED DESCRIPTION

Embodiments described herein improve accuracy of PLL operation (for both integer N and fractional-N PLLs) and particularly improve quantization error cancellation in fractional-N PLLs. Embodiments provide continuous calibration of quantization error phase cancellation without extra circuitry or complex algorithms. Both calibration and normal phase detection happens substantially simultaneously as explained further herein, and hence there is no need to disable lock for calibration to happen. Power consumption of the TDC is exactly the same as in conventional TDCs. In addition, the range of the phase detector implemented by the TDC is extended by 1 DCO period since both rising and falling edge information can be used for phase detection, which is significant for an embodiment in which the TDC is a thermometer/unit-weighted design.

Figure 1:
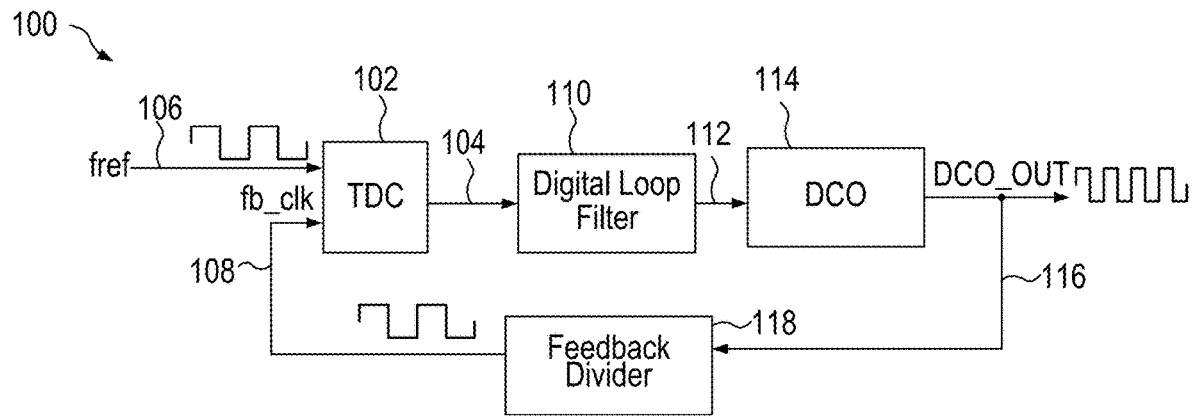
FIG. 1 illustrates a high level block diagram of a conventional digital PLL.
Figure 2:
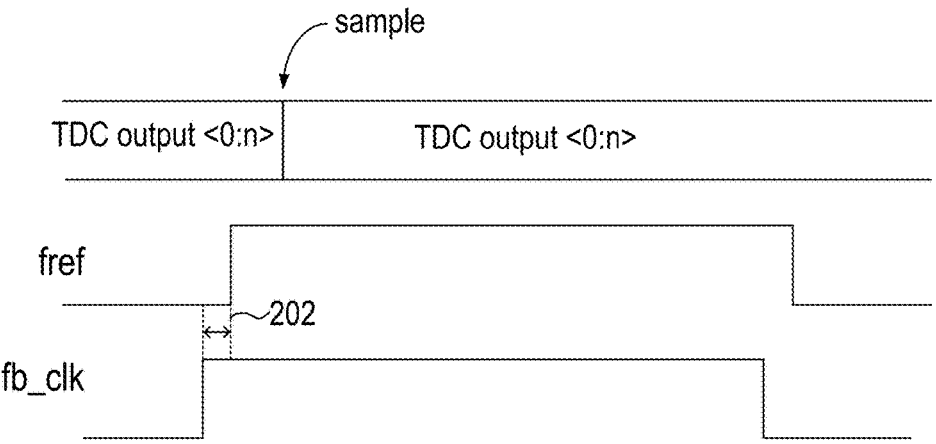
FIG. 2 illustrates a timing diagram of the reference clock, the feedback clock, and the TDC output.
Figure 3:
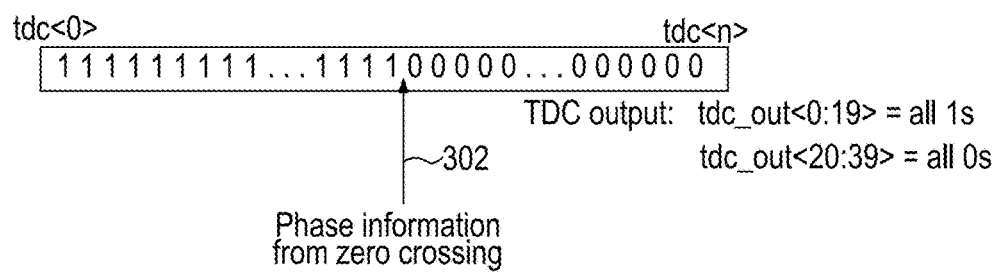
FIG. 3 illustrates the TDC output with the PLL locked.
Figure 4:
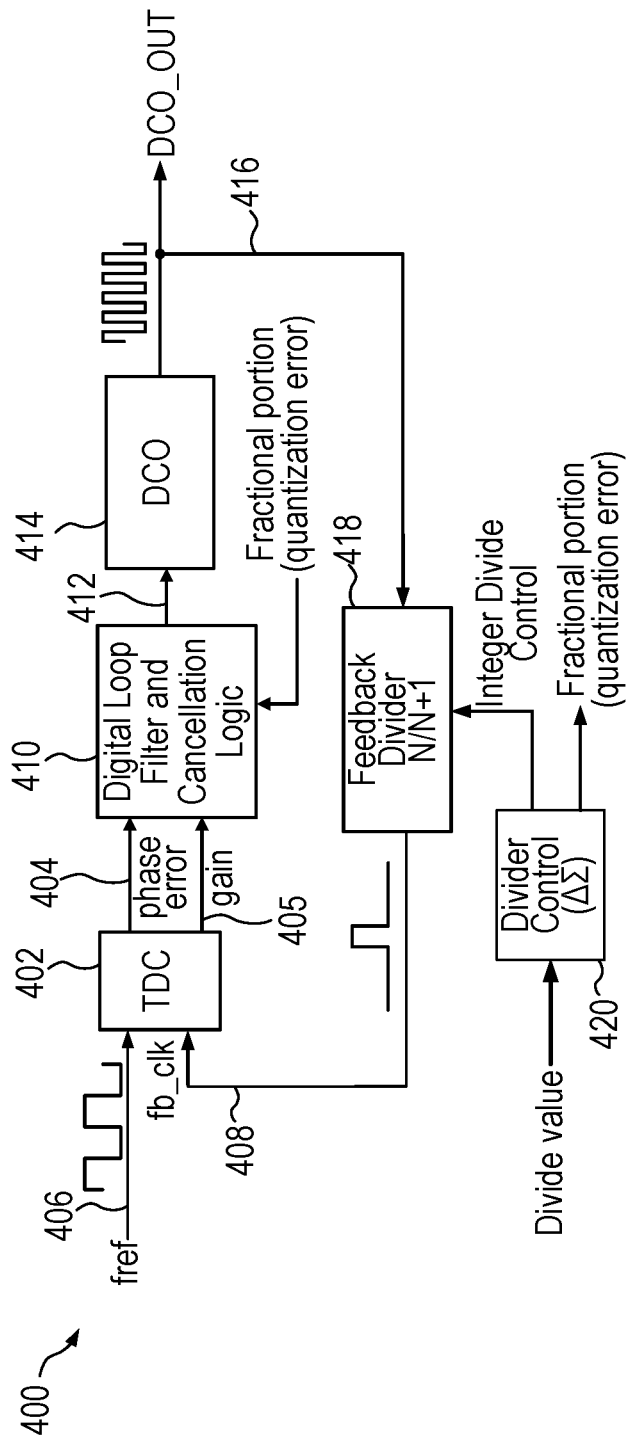
FIG. 4 illustrates an embodiment of a PLL in which the TDC simultaneously provides phase error and gain information during normal operation of the PLL.
Figure 5:
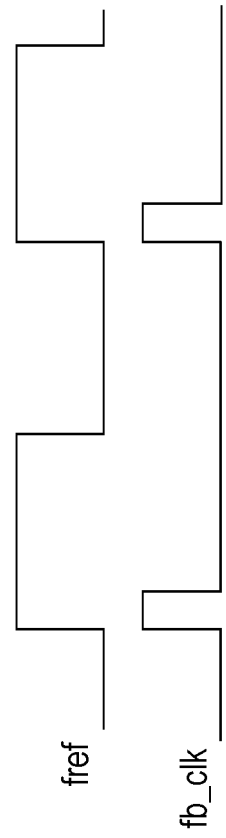
FIG. 5 illustrates the feedback divider supplying a feedback clock signal (fb_clk) with a pulse width equal to the period of the DCO_OUT signal.

FIG. 4 illustrates an embodiment of a PLL 400 in which the TDC simultaneously provides phase error and gain information during normal operation of the PLL. While the operation of PLL 400 is similar to PLL 100, differences allow continuous calibration using the gain information from the TDC as well as the phase error between ref_clk and fb_clk being provided to the loop filter to control the DCO and maintain the PLL in lock. The PLL 400 includes a time-to-digital converter (TDC) 402 that supplies the phase difference 404 between the reference clock (fref) 406 and feedback clock signal (fb_clk) 408. The phase difference 404 is supplied to the digital loop filter and cancellation logic 410 that supplies a control signal 412 to the DCO 414. The digital loop filter and cancellation logic 410 is described further herein. The DCO 414 supplies an output signal 416 to the feedback divider 418, which in turn divides the DCO_OUT signal 416 to generate the feedback clock signal (fb_clk) 408. However, instead of supplying a feedback clock signal with a 50% duty cycle, the feedback divider 418 supplies a feedback clock signal (fb_clk) as shown in FIG. 5 with a pulse width equal to the period of the DCO_OUT signal. That facilitates the extraction of both phase information and gain information from the TDC output.

FIG. 6 illustrates a block diagram of an embodiment of the TDC 402. As known to those of skill in the art, many TDC implementations are known and various embodiments utilize a TDC implementation suitable for the particular embodiment. The TDC 402 shown in FIG. 6 includes a plurality of delay elements 602 and flip-flops 604. The fb_clk 408 has a pulse width equal to the period of DCO_OUT and is supplied to the delay elements and the flip-flops. A delayed version of the reference clock signal (delayed_fref) 606 samples the TDC and provides the TDC output $<Q_0:Q_{n-1}>$. With the rising edge of fb_clk, 1's begin to traverse down the delay elements of the TDC. With the falling edge of the fb_clk, 0's begin to traverse down the delay elements. FIG. 7 illustrates the fb_clk 408 pulse 702, the rising edge of the delayed fref 606 at 704 resulting the sampling of the TDC at 706 responsive to the rising edge of the delayed fref signal 606.

Figure 8:
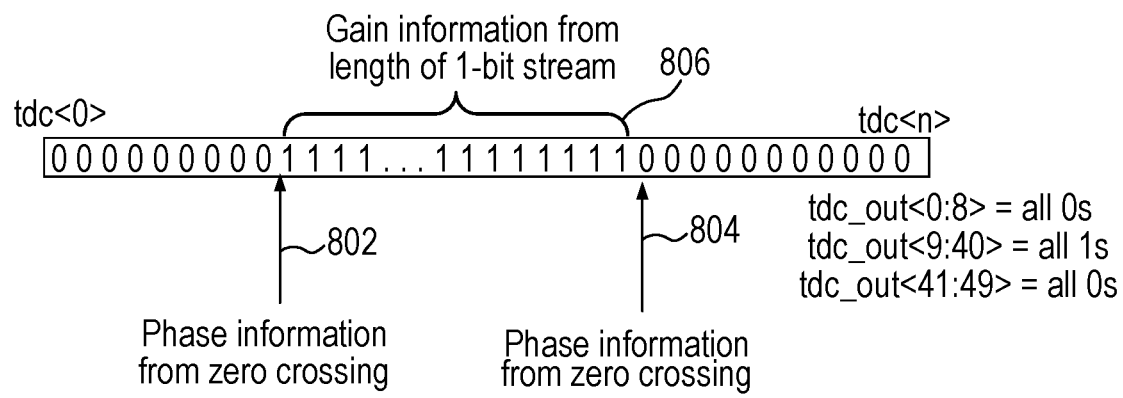
FIG. 8 illustrates an example of the TDC output.

FIG. 8 illustrates an example of the TDC output. FIG. 8 assumes a TDC that supplies 50 sample points. Because the pulse of the feedback clock signal is short (1 DCO period) as shown in FIG. 7, the first 9 bits tdc_out<0:8>=all 0s reflecting that the falling edge of the feedback pulse occurs before the sample is taken at 706 and 0s start to traverse down the delay elements before the sample is taken. The middle bits of the TDC output tdc<9:40>=all 1s, reflecting the feedback pulse. Finally, the remaining bits in the TDC output tdc<41:49>=all 0s reflecting the condition of the fb_clk before the pulse. The phase information can be extracted at the transitions between 0 and 1 at either or both 802 and 804. The gain information is indicated by the length of the 1 bit stream at 806. In the example given, the length of the 1-bit stream is 32 bits. Thus, the 32 1-bit stream corresponds to the period of DCO_OUT. Thus, the period of the DCO_OUT clock corresponds to 32 delay elements of the TDC.

That gain information is particularly useful in calibrating the cancellation of quantization error in fractional-N PLLs. Fractional-N PLLs allow dividing the DCO_OUT signal by a non-integer number. Referring back to FIG. 4, the divider control block 420 includes a ΔΣ modulator. The feedback divider 418 is a multi-modulus divider that in an embodiment can divide by N or N+1 according to the modulus control signal provided by the ΔΣ modulator. Of course, multi-modulus dividers with a wider range can also be used and are well known in the art.

Figure 9:
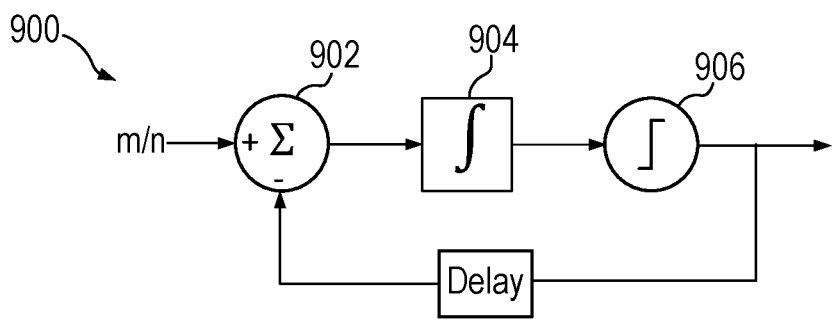
FIG. 9 illustrates an embodiment of a first order $\Delta\Sigma$ modulator.

By way of example to illustrate the source of quantization errors in fractional-N PLLs, FIG. 9 illustrates a first order ΔΣ modulator 900 that generates the modulus control signal for the feedback divider. The ΔΣ modulator 900 receives the fractional value m/n of the divide value at summer 902. The integrator 904 accumulates the output of the summer and supplies quantizer 906. When the accumulated value is greater than 1, quantizer 906 supplies a 1 and otherwise a 0. The quantizer output is the modulus control signal for the feedback divider and the quantizer output is also subtracted from the input m/n in summer 902. Quantizer 906 supplies a stream of 1s and 0s with a 1 s density that equals the fractional value m/n as the modulus control signal. For example, a divide value being supplied to the divide control block 420 (see FIG. 4) of 10¼ results in the divide control circuit supplying a divide control signal that averages 10¼ but has deterministic error. Thus, in the illustrated example the feedback divider divides by 10 or 11 with an average divide value of 10¼. For example, the modulus control signal causes the divider to divide by 10, 10, 11, and 10 to average 10¼. The deterministic error is the error between the actual divide value (N or N+1) and the average divide value of 10¼ resulting in a deterministic phase error being supplied to the loop filter by the TDC. That deterministic error is the quantization error resulting from the modulus control signal supplied by the quantizer 906. Embodiments cancel the quantization error to improve the performance of the PLL. Note that while a first order ΔΣ modulator is illustrated here, other embodiments use a second or higher order ΔΣ modulator according to the needs of the system along with an appropriately matched multi-modulus divider.

Figure 10:
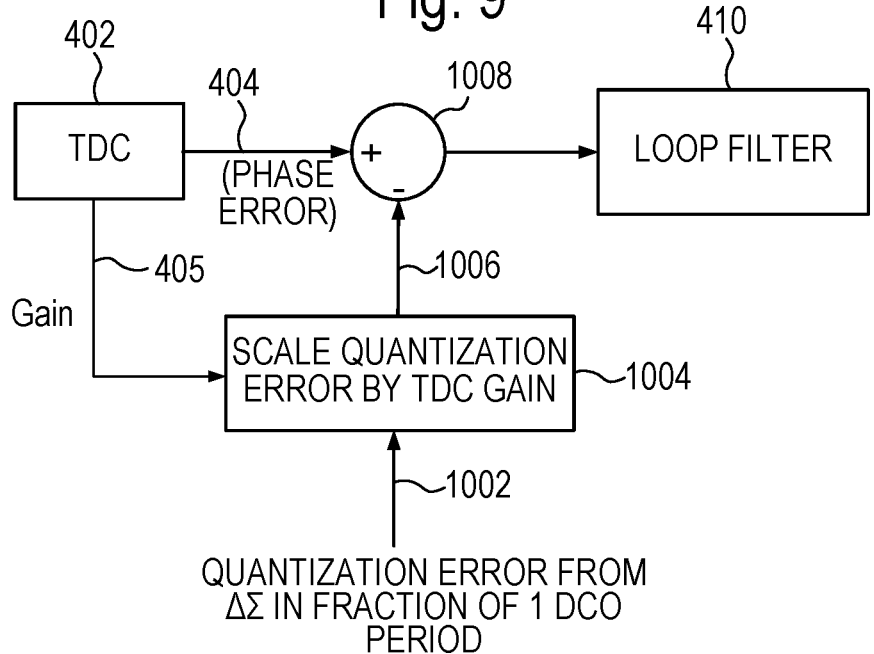
FIG. 10 illustrates an embodiment of quantization error cancellation using the gain information from the TDC.

FIG. 10 illustrates an embodiment of quantization error cancellation using the gain information from the TDC to more accurately cancel the quantization error. The gain information 405 supplied by TDC 402 (see FIG. 4) is used to scale the quantization error 1002 in the scaling block 1004. Thus, the TDC bits per DCO period is used to scale the quantization error. For example, if the 1-bit stream is 32 and the quantization error is 0.75, the quantization error is scaled to 24 and supplied as the scaled quantization error 1006 to the summer 1008. When the number of delay elements in the 1-bit stream changes due to voltage, temperature, or aging, the scaling changes. Summer 1008 subtracts the adjusted quantization error from the phase error (phase difference between fb_clk and ref_clk) supplied by the TDC. Since the gain information is continually calibrated against the period of the DCO output, the quantization error cancellation is also continually calibrated during regular operation of the PLL without having to take the PLL out of lock. Note that while the cancellation logic including scale logic 1004 and summer 1008 are shown as being separate from the loop filter 402 for ease of illustration, in embodiments they are incorporated into digital logic in the loop filter 410.

While the gain information from the TDC is particularly useful to more accurately cancel quantization error in fractional-N PLLs, the gain information from the TDC can also be used to make the loop filter constants more accurately match the VCO gain in both integer N and fractional-N PLLs.

Thus, a PLL providing both gain and phase information from the TDC has been described. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and do not otherwise indicate or imply any order in time, location, or quality. Variations and modifications of the embodiments disclosed herein may be made based on the description set forth herein, without departing from the scope of the invention as set forth in the following claims.

What is claimed is:

1. A method comprising:
    recovering phase information from an output of a time-to-digital converter (TDC), the phase information indicative of a phase error between a reference clock signal and a feedback clock signal;
    recovering gain information from the output of the TDC, the gain information indicative of a relationship between a step size of the TDC and a period of a digitally controlled oscillator (DCO) output signal supplied by a DCO;
    adjusting a quantization error of a delta sigma modulator based on the relationship between a step size of the TDC and a period of the DCO output signal, as indicated in the gain information, to generate an adjusted quantization error; and
    adjusting the phase information with the adjusted quantization error.

2. The method as recited in claim 1 further comprising, generating the feedback clock signal with a pulse width equal to a period of the DCO output signal.

3. The method as recited in claim 2 further comprising, recovering the phase information based on a transition between zeros and ones in the output of the TDC.

4. The method as recited in claim 2 further comprising, recovering the gain information based on a length of ones in the output of the TDC.

5. The method as recited in claim 1 wherein the output of the TDC includes both a one to zero transition and a zero to one transition and either or both transitions can be used to determine the phase information.

6. The method as recited in claim 1 further comprising adjusting the quantization error by scaling the quantization error based on a number of TDC bits per DCO period.

7. A phase-locked loop (PLL) comprising:
    a time-to-digital converter (TDC) coupled to receive a reference clock signal and a feedback clock signal and configured to provide a TDC output providing phase information, the phase information indicative of a phase difference between the reference clock signal and the feedback clock signal;
    a feedback divider coupled to a digitally controlled oscillator (DCO) output signal and configured to divide the DCO output signal and supply the feedback clock signal to the TDC;
    wherein the TDC output further provides gain information, the gain information indicative of a relationship between a step size of the TDC and a period of the DCO output signal;
    a delta sigma modulator to control the feedback divider and provide a quantization error; and
    a scaling circuit to scale the quantization error from the delta sigma modulator based on the gain information, which indicates the relationship between the step size of the TDC and the period of the DCO output signal, and the scaling circuit to provide a scaled quantization error.

8. The PLL as recited in claim 7 wherein the feedback divider is configured to generate the feedback clock signal having a pulse width of a period of a DCO output clock signal.

9. The PLL as recited in claim 8 wherein the TDC comprises a plurality of delay elements and flip-flops and the phase information is indicated by a transition between zeros and ones in the TDC output from the flip-flops and the gain information is indicated as a number of 1s in the TDC output, each of the 1s corresponding to one of the delay elements.

10. The PLL as recited in claim 9 wherein the gain information is based on a number of delay elements in the TDC that correspond to the period of the DCO output clock signal.

11. The PLL as recited in claim 7 further comprising a summing circuit to subtract the scaled quantization error from the phase information supplied by the TDC to thereby cancel the adjusted quantization error and generate adjusted phase information.

12. The PLL as recited in claim 11 further comprising a loop filter coupled to the TDC and configured to supply a control signal to the DCO based on the adjusted phase information.

13. The PLL as recited in claim 7 wherein the quantization error is scaled based on a number of TDC bits per period of the DCO output signal.

14. An apparatus comprising:
    a digitally controlled oscillator (DCO) configured to supply a DCO output signal;
    a feedback divider coupled to the DCO output signal and configured to divide the DCO output signal and generate a feedback clock signal, the feedback clock signal having a pulse width equal to a period of the DCO output signal;
    a time-to-digital converter (TDC) coupled to receive a reference clock signal and the feedback clock signal and configured to provide phase information in a TDC output, the phase information indicative of a phase difference between the reference clock signal and the feedback clock signal;
    wherein the TDC output further provides gain information, the gain information indicative of a relationship between a step size of the TDC and a period of the DCO output signal;
    a delta sigma modulator coupled to control the feedback divider and supply a quantization error; and
    a scale circuit to scale the quantization error from the delta sigma modulator according to the gain information indicative of the relationship between the step size of the TDC and the period of the DCO output signal and the scale circuit to provide an adjusted quantization error.

15. The apparatus as recited in claim 14 wherein the TDC includes a plurality of delay elements and each of the delay elements corresponds to the step size of the TDC.

16. The apparatus as recited in claim 15 wherein the gain information is indicated as a number of 1s in the TDC output, each of the 1s corresponding to one of the delay elements.

17. The apparatus as recited in claim 14 further comprising a summing circuit to subtract the adjusted quantization error from the phase information supplied by the TDC to thereby cancel the adjusted quantization error and generate adjusted phase information.

18. The apparatus as recited in claim 17 further comprising a loop filter coupled to the TDC and configured to supply a control signal to the DCO based on the adjusted phase information.

* * * * *